US006771006B2

(12) United States Patent
Zioter et al.

(10) Patent No.: US 6,771,006 B2
(45) Date of Patent: Aug. 3, 2004

(54) CYLINDRICAL ULTRASOUND TRANSCEIVERS

(75) Inventors: Yitzhak Zioter, Holon (IL); Gideon Shenholz, Tel Aviv (IL); Boris Gluzman, Petach Tikva (IL); Boris Salnikov, Petach Tikva (IL)

(73) Assignee: Pegasus Technologies Ltd., Azoor (IL)

( * ) Notice: Subject to any disclaimer, the term of this patent is extended or adjusted under 35 U.S.C. 154(b) by 17 days.

(21) Appl. No.: 10/050,526

(22) Filed: Jan. 18, 2002

(65) Prior Publication Data

US 2003/0137224 A1 Jul. 24, 2003

(51) Int. Cl.[7] .......................... H01L 41/04; H01L 41/08; H02N 2/00

(52) U.S. Cl. ....................... 310/334; 310/335; 310/800; 310/336; 310/369; 310/366

(58) Field of Search ................................ 310/334–337, 310/369, 800, 366, 322

(56) References Cited

U.S. PATENT DOCUMENTS

| | | | | | |
|---|---|---|---|---|---|
| 3,978,353 | A | * | 8/1976 | Kinoshita | 310/317 |
| 4,216,403 | A | * | 8/1980 | Krempl et al. | 310/328 |
| 4,469,978 | A | * | 9/1984 | Hamada et al. | 310/366 |
| 4,633,122 | A | * | 12/1986 | Radice | 310/339 |
| 4,706,681 | A | | 11/1987 | Breyer et al. | 600/374 |
| 4,728,844 | A | * | 3/1988 | Wilson et al. | 310/327 |
| 4,758,691 | A | | 7/1988 | De Bruyne | 178/18.09 |
| 4,825,116 | A | * | 4/1989 | Itoh et al. | 310/335 |
| 6,140,740 | A | * | 10/2000 | Porat et al. | 310/322 |
| 6,239,535 | B1 | * | 5/2001 | Toda et al. | 310/334 |
| 6,392,330 | B1 | * | 5/2002 | Zloter et al. | 310/334 |
| 6,400,065 | B1 | * | 6/2002 | Toda et al. | 310/334 |
| 6,411,014 | B1 | * | 6/2002 | Toda | 310/334 |
| 6,508,775 | B2 | * | 1/2003 | McKenzie et al. | 601/2 |
| 6,542,564 | B2 | * | 4/2003 | Cho | 375/372 |

FOREIGN PATENT DOCUMENTS

| | | |
|---|---|---|
| WO | WO98/40838 | 9/1998 |

* cited by examiner

*Primary Examiner*—Thomas M. Dougherty
*Assistant Examiner*—J. Aguirrechea
(74) *Attorney, Agent, or Firm*—Mark M. Friedman

(57) ABSTRACT

An ultrasound transducer that includes a piezoelectric film having a first end and a second end, a plurality of electrodes disposed on the piezoelectric film, at least one securing member and a support structure which is generally cylindrical. The first end and the second end of the piezoelectric film are secured to the support structure by at least one securing member.

16 Claims, 13 Drawing Sheets

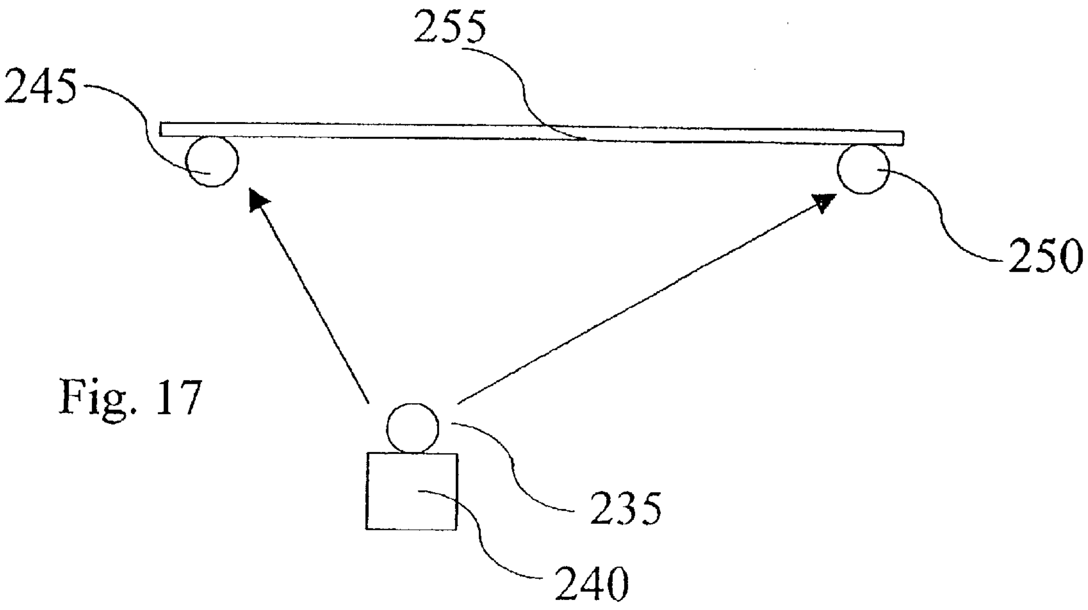
Fig. 17
Fig. 18
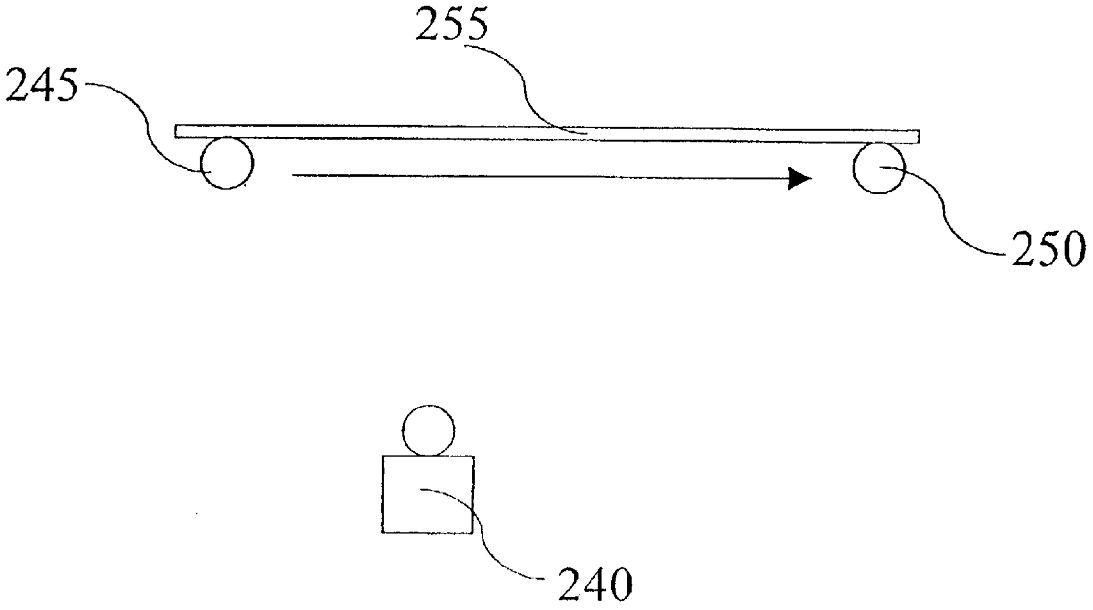

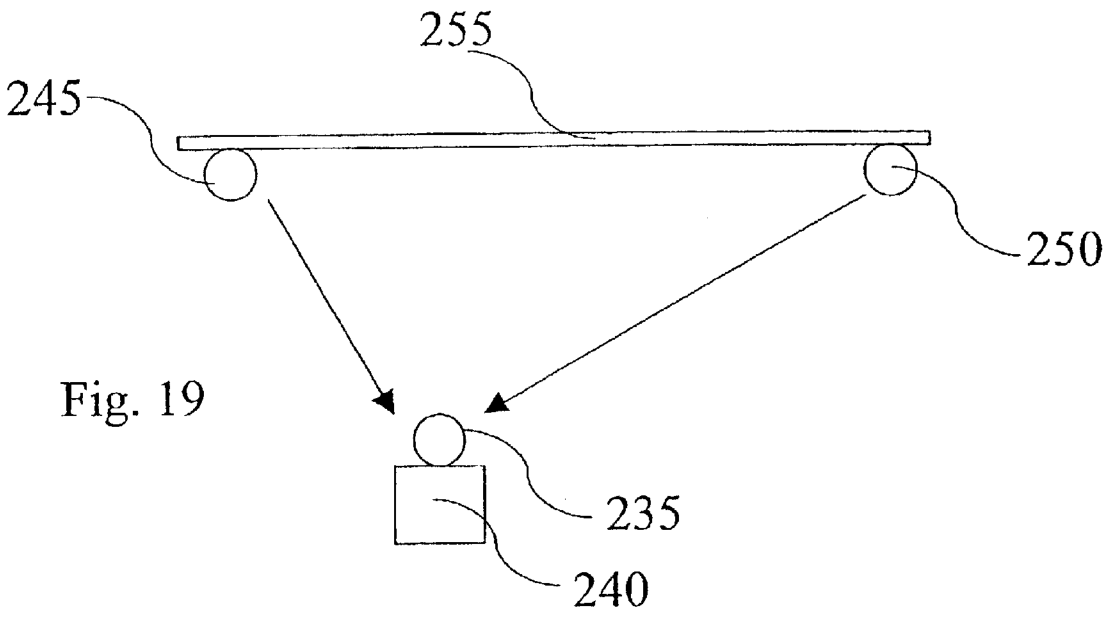
Fig. 19
Fig. 20
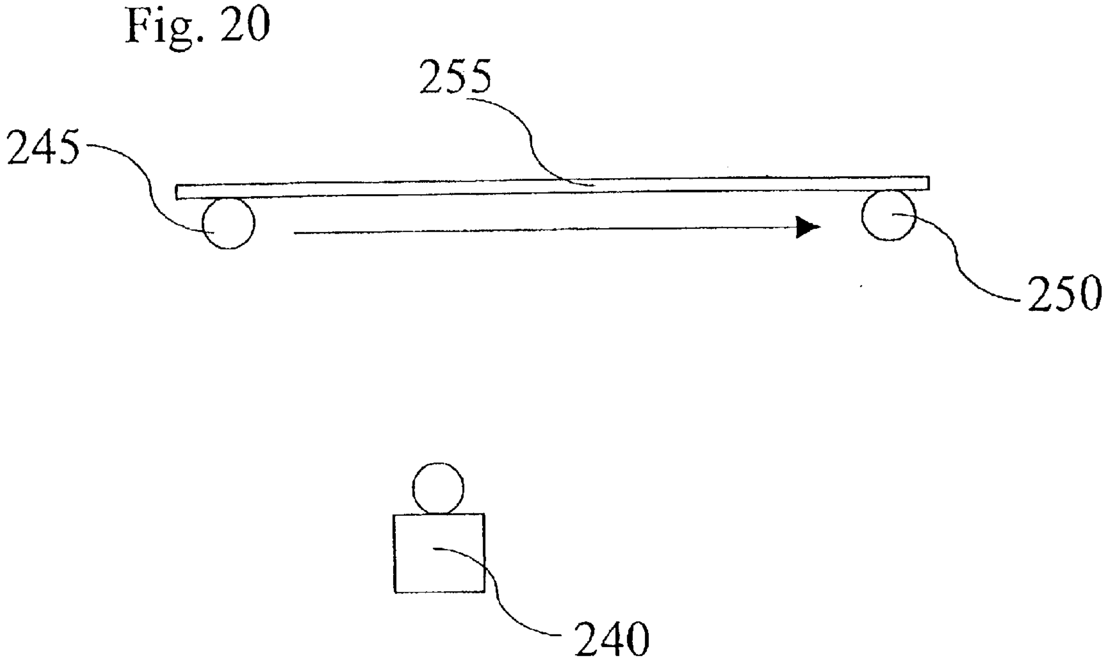

CYLINDRICAL ULTRASOUND TRANSCEIVERS

FIELD AND BACKGROUND OF THE INVENTION

The present invention relates to ultrasound transducers and, in particular, it concerns cylindrical ultrasound receivers and transceivers formed from piezoelectric films, and their applications in digitizer systems.

It is known to employ cylindrical ultrasound transducers for transmitting ultrasound signals in digitizer systems. The cylindrical form provides all-around signal transmission and simplifies the geometry of time-of-flight calculations by providing an effect similar to a point (or more accurately, line) source. These advantages are detailed in U.S. Pat. No. 4,758,691 to De Bruyne. A further advantage of cylindrical ultrasound transducers is that they can be centered on an element of which the position is to be measured. This is used in a drawing implement digitizer system described in PCT publication WO98/40838.

Structurally, a number of different types of cylindrical transducer have been proposed. The De Bruyne patent proposes a "Sell transducer" which is a capacitive device formed from a complicated arrangement of cylindrical layers intended to produce a cylindrical air gap of about 20 $\mu$m. Such a structure is costly to manufacture, and is likely to be unreliable.

A second type of transducer that has been proposed in the field of medical applications is based on piezoelectric elements. An example of a medical transducer of this type may be found in U.S. Pat. No. 4,706,681 to Breyer et al., which discloses an ultrasonic marker. Here, a cylindrical piezoelectric collar is sandwiched between two electrodes. Application of an alternating potential across the electrodes causes vibration of the collar, and hence emits a radially propagating ultrasonic signal.

In principle, any ultrasonic transducer is capable of being operated both as a transmitter and a receiver. In practice, however, many considerations result in many transmitter structures being ineffective as receivers. This is particularly true of cylindrical elements in which almost the entire cylinder contributes to wide angle transmission by actuation with a relatively high power while only a small portion of the cylinder is correctly orientated for receiving an incoming signal from a given direction. Furthermore, the inherent capacitance of the large inactive region of the transducer may absorb a large proportion of the amplitude of a received signal, rendering the transducer insensitive as a receiver.

In the field of transducers in general, much work has been invested in development of devices based on piezoelectric films, such as PVDF. Conductive electrodes are formed on opposite faces of the film, typically by selectively printing conductive ink on regions of the surfaces. These films are cheap to produce, and withstand a wide range of operating conditions including exposure to moisture.

Although a cylindrical ultrasound transducer is relatively simple to implement using piezoelectric film, implementation of a receiver poses additional problems beyond the general complications of cylindrical receivers discussed above. Specifically, referring to FIGS. 1, 2 there is shown a schematic plan view of a freely suspended cylinder 10 formed from piezoelectric film. FIG. 1 shows its relaxed state, while FIG. 2 shows the response of cylinder 10 to an incoming ultrasound signal wave front 15. Since the piezoelectric film is flexible, the oscillations of signal 15 generate waves (exaggerated for clarity) traveling around cylinder 10. The direction and extent of flexing of the piezoelectric film varies along the waveform created around the cylinder, resulting in reversal of the sense of an electrical potential generated between the electrodes. As a result, much of the potential generated by the piezoelectric film may be dissipated in local eddy currents within the electrodes, greatly reducing the overall signal voltage as measured between the electrodes.

A further problem of implementing a cylindrical ultrasound transducer using piezoelectric film is the tendency for the electrode to act as an antenna, picking up unwanted electromagnetic radiation which may result in very low signal to noise ratios.

A further problem of implementing a cylindrical ultrasound transducer using piezoelectric film is to provide mechanical protection for the transducer while minimizing disruption of the ultrasound waves.

A further problem of implementing a cylindrical ultrasound transducer using piezoelectric film is the damage caused through welding the piezoelectric film to form a cylinder.

There is therefore a need for a cylindrical ultrasound receiver structure employing piezoelectric film.

SUMMARY OF THE INVENTION

The present invention is a cylindrical ultrasound receiver structure employing piezoelectric film.

According to the teachings of the present invention there is provided an ultrasound transducer comprising: (a) a piezoelectric film having a first end and a second end; (b) a plurality of electrodes disposed on the piezoelectric film; (c) at least one securing member; and (d) a support structure, which is substantially cylindrical, wherein the first end and the second end are secured to the support structure by the at least one securing member.

According to a further feature of the present invention, there is also provided an electrical contact disposed on the support structure.

According to a further feature of the present invention, the support structure further includes a protrusion and wherein the first end and the second end are secured to the protrusion by the at least one securing member.

According to a further feature of the present invention: (a) the support structure has a central axis; (b) the protrusion is formed as an elongated projecting ridge having a direction of elongation; and (c) the direction of elongation being substantially parallel to the central axis.

According to a further feature of the present invention, there is also provided an electrical contact disposed on the protrusion.

According to a further feature of the present invention, the at least one securing member is a clip.

According to a further feature of the present invention, there is also provided an electrical contact wherein the electrical contact is disposed on the at least one securing member.

According to a further feature of the present invention, the piezoelectric film has a first surface and a second surface and wherein the electrodes include: (a) a first electrode disposed on the first surface; (b) a second electrode disposed on the second surface wherein at least a part of the second electrode is in an opposing relationship with at least a part of the first electrode; (c) a first electrical connecting strip disposed on the first surface wherein the first electrical connecting strip is connected to the first electrode; and (d) a second electrical connecting strip disposed on the second surface in a substantially non-opposing relationship with the first electrical connecting strip wherein the second electrical connecting strip is connected to the second electrode.

According to a further feature of the present invention, the piezoelectric film has a first surface and a second surface and wherein the electrodes include: (a) a first electrode and a second electrode disposed on the first surface, wherein the first electrode is disposed in a pattern that is non-contiguous with the second electrode; (b) a third electrode and a fourth electrode disposed on the second surface, wherein: (i) at least a part of the third electrode is in an opposing relationship with at least a part of the first electrode; (ii) at least a part of the fourth electrode is in an opposing relationship with at least a part of the second electrode; and (iii) the third electrode is disposed in a pattern that is non-contiguous with the fourth electrode; and (c) an electrical joining strip extending from the first electrode to the fourth electrode, wherein the electrical joining strip includes a first portion of the electrical joining strip on the first surface and a second portion of the electrical joining strip on the second surface, and wherein the first portion and the second portion are electrically connected.

According to a further feature of the present invention, the first portion and the second portion are electrically connected via a hole in the piezoelectric film.

According to a further feature of the present invention, there is also provided a helical metal spring, wherein the helical metal spring is disposed around the piezoelectric film.

According to additional teachings of the present invention there is also provided an ultrasound receiver comprising: (a) a piezoelectric film having a first surface and a second surface; (b) a first electrode disposed on the first surface; (c) a second electrode disposed on the second surface wherein at least a part of the second electrode is in an opposing relationship with at least a part of the first electrode; (d) a first electrical connecting strip disposed on the first surface wherein the first electrical connecting strip is connected to the first electrode; and (e) a second electrical connecting strip disposed on the second surface in a substantially non-opposing relationship with the first electrical connecting strip wherein the second electrical connecting strip is connected to the second electrode.

According to a further feature of the present invention, the first electrical connecting strip is in a substantially non-opposing relationship with the second electrode; and the second electrical connecting strip is in a substantially non-opposing relationship with the first electrode.

According to a further feature of the present invention, there is also provided a substantially cylindrical element, which is hollow, formed primarily from the piezoelectric film, the substantially cylindrical element having a central axis and a height measured parallel to the central axis; and a support structure for supporting the substantially cylindrical element, the support structure being configured to support the substantially cylindrical element in such a manner as to allow propagation of vibration waves circumferentially around a major part of the substantially cylindrical element; wherein the first electrode is formed as a strip extending in an extensional direction substantially parallel to the central axis along at least a part of the height, the strip subtending at the central axis an angle of not more than 90°.

According to a further feature of the present invention, the substantially cylindrical element has an inner surface wherein the first surface forms the inner surface; and the second electrode is grounded.

According to additional teachings of the present invention there is also provided a multi-electrode ultrasound receiver comprising: (a) a piezoelectric film having a first surface and a second surface; (b) a first electrode and a second electrode disposed on the first surface, wherein the first electrode is disposed in a pattern that is non-contiguous with the second electrode; (c) a third electrode and a fourth electrode disposed on the second surface, wherein: (i) at least a part of the third electrode is in an opposing relationship with at least a part of the first electrode; (ii) at least a part of the fourth electrode is in an opposing relationship with at least a part of the second electrode; and (iii) the third electrode is disposed in a pattern that is non-contiguous with the fourth electrode; and (d) an electrical joining strip extending from the first electrode to the fourth electrode wherein the electrical joining strip includes a first portion of the electrical joining strip on the first surface and a second portion of the electrical joining strip on the second surface and the first portion and the second portion being electrically connected.

According to a further feature of the present invention, there is also provided a substantially cylindrical element, which is hollow, formed primarily from the piezoelectric film, the substantially cylindrical element having a central axis and a height measured parallel to the central axis and wherein the first electrode and the second electrode in combination subtend at the central axis an angle of not more than 90°; and a support structure for supporting the substantially cylindrical element, the support structure being configured to support the substantially cylindrical element in such a manner as to allow propagation of vibration waves circumferentially around a major part of the substantially cylindrical element.

According to a further feature of the present invention, the substantially cylindrical element has an inner surface wherein the first surface forms the inner surface; and the third electrode is grounded.

According to a further feature of the present invention, the first portion and the second portion are electrically connected via a hole in the piezoelectric film.

According to a further feature of the present invention, there is also provided a first electrical connecting strip disposed on the first surface, wherein the first electrical connecting strip is connected to the second electrode; and a second electrical connecting strip disposed on the second surface, wherein the second electrical connecting strip is connected to the third electrode and the second electrical connecting strip is in a substantially non-opposing relationship with the first electrical connecting strip.

According to additional teachings of the present invention there is also provided a method for providing shielding for an ultrasound transducer used for a predetermined frequency of ultrasound waves while minimizing disruption to the ultrasound waves, comprising the steps of spacing windings of a helical metal spring at a spatial period of less than about half of a wavelength of the ultrasound waves associated with the ultrasound transducer; and positioning the helical metal spring surrounding the ultrasound transducer.

According to a further feature of the present invention, the step of spacing is performed by spacing the windings at a spatial period of less than about quarter of the wavelength.

According to additional teachings of the present invention there is also provided a digitizer system comprising: (a) an ultrasound transducer associated with a moveable element; (b) two ultrasound transducers; (c) a base unit; wherein the two ultrasound transducers are maintained in fixed geometrical relation by attachment to the base unit; and (d) an acoustic wave-guide; wherein the acoustic wave-guide includes a hollow elongated member and the acoustic wave-guide is disposed between the two ultrasound transducers.

According to a further feature of the present invention, the acoustic wave-guide is substantially straight.

According to a further feature of the present invention, the acoustic wave-guide is curved.

According to additional teachings of the present invention there is also provided a method for operating a system for determining a position of a point on a moveable element, the system including: a moveable group of ultrasound transducers including a first ultrasound transducer and a second ultrasound transducer each mounted on the moveable element where the first ultrasound transducer, the second ultrasound transducer and the point on the moveable element are sequentially spaced along a common axis; and a fixed group of ultrasound transducers including a third ultrasound transducer and a fourth ultrasound transducer spaced apart by a predefined distance, the method for operating comprising the steps of: (a) transmitting a plurality of measurement signals between the first ultrasound transducer and the fixed group and between the second ultrasound transducer and the fixed group; (b) deriving distances between the first ultrasound transducer and each of the third ultrasound transducer and the fourth ultrasound transducer and between the second ultrasound transducer and each of the third ultrasound transducer and the fourth ultrasound transducer from time-of-flight measurements for the measurement signals; and (c) deriving from the distances a position of the point.

According to a further feature of the present invention, the first ultrasound transducer and the second ultrasound transducer are both cylindrical ultrasound transducers.

BRIEF DESCRIPTION OF THE DRAWINGS

The invention is herein described, by way of example only, with reference to the accompanying drawings, wherein:

FIG. 17 is a schematic representation of the operation of a system for determining the position of a moveable element, constructed and operable in accordance with a preferred embodiment of the invention, operating in a primary mode of operation;

FIG. 18 is a schematic representation of the operation of the system of FIG. 17 while performing a self-calibration operation;

FIG. 19 is a schematic representation of the operation of a system for determining the position of a moveable element, constructed and operable in accordance with an alternate embodiment of the invention, operating in a primary mode of operation;

FIG. 20 is a schematic representation of the operation of the system of FIG. 19 while performing a self-calibration operation;

DESCRIPTION OF THE PREFERRED EMBODIMENTS

The present invention is a cylindrical ultrasound receiver or transceiver formed from piezoelectric films. The invention also provides applications of such transceivers in digitizer systems.

The principles and operation of receivers and transceivers according to the present invention may be better understood with reference to the drawings and the accompanying description.

Figure 3:
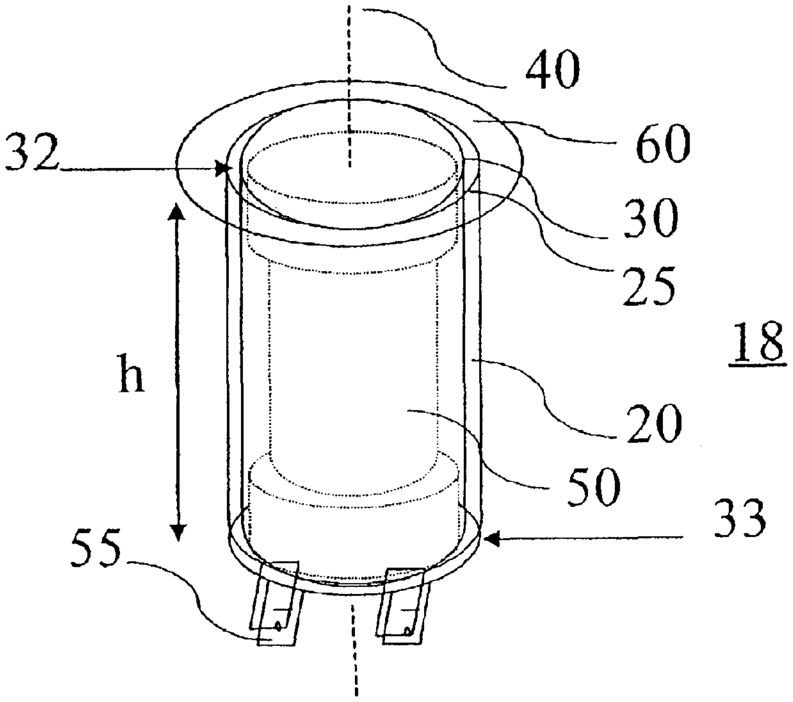
FIG. 3 is an isometric view of a cylindrical ultrasound receiver that is constructed and operable in accordance with a preferred embodiment of the invention.

Reference is now made to FIG. 3, which is an isometric view of a cylindrical ultrasound receiver 18 that is constructed and operable in accordance with a preferred embodiment of the invention. Generally speaking, receiver 18 includes a substantially cylindrical element 20, which is hollow. Cylindrical element 20 is formed primarily from flexible piezoelectric film, having an outer surface 25, an inner surface 30, an upper edge 32, a lower edge 33, a central axis 40 and a height h measured parallel to central axis 40. Cylindrical element 20 is supported by a support structure, represented here by a core element 50, configured to support cylindrical element 20 in such a manner as to allow propagation of vibration waves circumferentially around a major part of cylindrical element 20. Cylindrical element 20 is supported from below by a base 55 and above by a cap 60.

As mentioned above, cylindrical element 20 is substantially cylindrical in that cylindrical element 20 approximates to a cylindrical shape over at least a majority of its circumference. This cylindrical portion provides the receiving functionality and therefore it is not critical if the non-functional portion is not cylindrical. Moreover, the cylindrical portion itself does not have to be accurately cylindrical. An application of this is discussed later in reference to FIG. 12.

Figure 2:
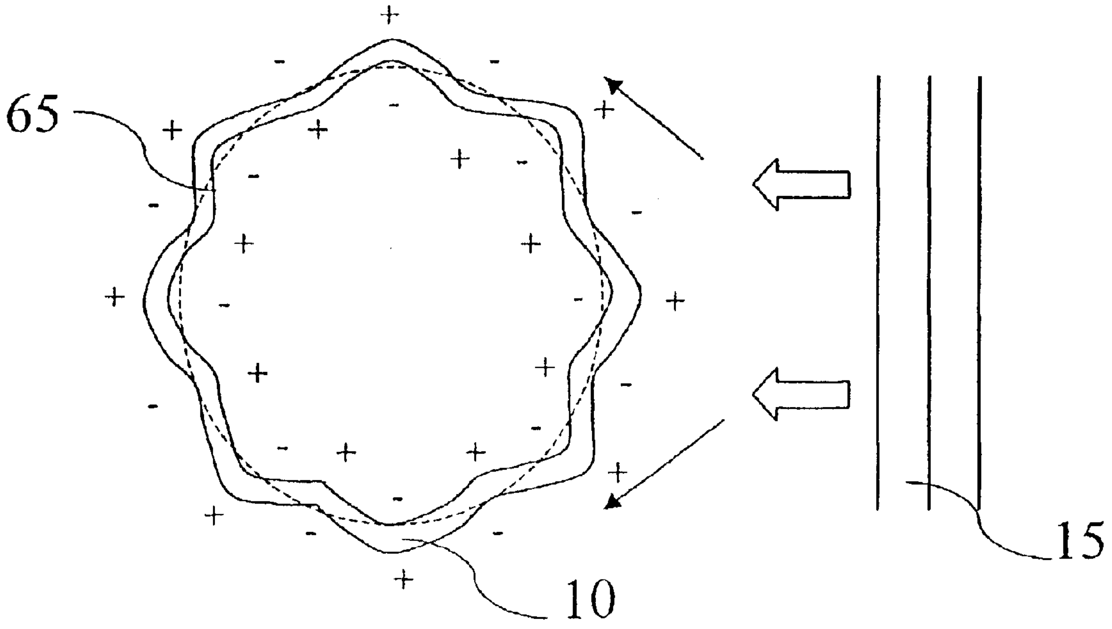
FIG. 2 is a schematic view of the cylinder of FIG. 1 when exposed to an ultrasonic signal.
Figure 4:
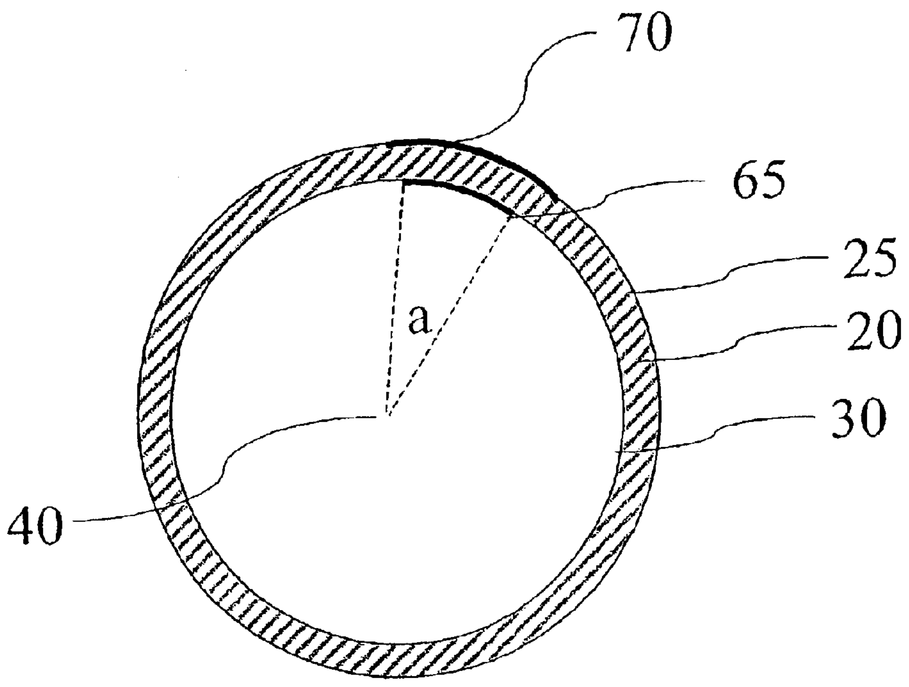
FIG. 4 is a schematic plan view of the film for use in FIG. 3.

Reference is now made to FIG. 4, which is a schematic plan view of cylindrical element 20 that is constructed and operable in accordance with a preferred embodiment of the invention. A first electrode 65 is applied to inner surface 30. A second electrode 70 is applied to outer surface 25, where at least a part of second electrode 70 is in an opposing relationship with a majority of first electrode 65. Second electrode 70 is grounded and first electrode 65 acts as a sensing electrode. However, it should be noted that first electrode 65 and second electrode 70 are interchangeable for use in other embodiments of the invention. First electrode 65 is formed as a strip extending in an extensional direction substantially parallel to central axis 40 along a major part of height h (FIG. 3), and subtending at central axis 40 an angle α of not more than 90°. The dimension of first electrode 65 is preferably chosen such that it corresponds to less than about ¼ wavelength of the vibrations in cylindrical element 20 induced by ultrasound vibrations of the intended working frequency. In most cases, the dimensions are chosen such that cylindrical element 20 supports only about one wavelength of the vibrations (rather than the about four wavelengths illustrated schematically in FIG. 2) so as to minimize interference effects and the like. As a result, phase canceling problems can largely be avoided so long as first electrode 65 subtends an angle α of less than about 90° at central axis 40. Preferably, however, the width of first electrode 65 is typically chosen to subtend an angle α of between about 20 and about 30° at central axis 40.

Figure 1:
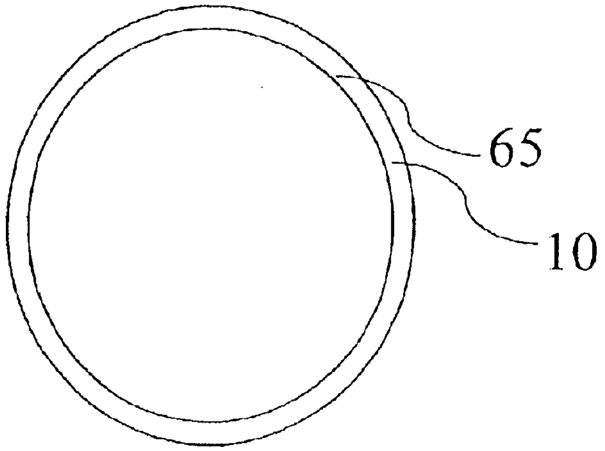
FIG. 1 is a schematic plan view of a freely suspended cylinder formed from piezoelectric film in its relaxed state.

The principle of operation of receiver 18 may be appreciated by referring back to FIGS. 1 and 2. As described above, the incident pressure waves 15 tend to induce vibration waves, which propagate around the periphery of cylinder 10. As a result, an arbitrarily positioned localized sensor on the surface of cylinder 10 experiences substantially the same vibrations substantially independent of the direction from which pressure waves 15 are incident. At the same time, since the circumferential extent of first electrode 65 is small relative to the wavelength of the vibrations propagating through the film, the aforementioned problems of phase canceling and large capacitance are avoided. The result is a highly effective, wide-angle ultrasound receiver. These and other advantages of the configuration of the present invention will become clearer from the following more detailed description.

With regard to materials, it should be noted that the present invention might be implemented using any piezoelectric film material and suitable conductive electrode material. A particularly preferred example for the film itself is Polyvinyl Diflouride (PVDF). The direction of polarization should be oriented circumferentially around the cylindrical element. The use of such films provides particular advantages due to its wide frequency-band response. Specifically, it has been found that conventional narrow frequency-band receivers based on piezo-ceramics tend to shift signal noise into the frequency range of measurement, drastically reducing the signal-to-noise ratio. In contrast, the wide frequency-band receivers of the present invention, used in combination with subsequent filtering to identify the signal of interest, have been found to provide a greatly enhanced signal-to-noise ratio.

Suitable conductive materials for the electrodes include, but are not limited to, compositions containing carbon, silver and gold. In applications in which a transparent structure is required, a transparent conductive material is used. The conductive materials have been described as being "applied" to the piezoelectric film, as application of the conductive material is the typical production process. However, it should be notes that the conductive materials could be "disposed" on to the piezoelectric film using other methods known in the art.

Figure 5:
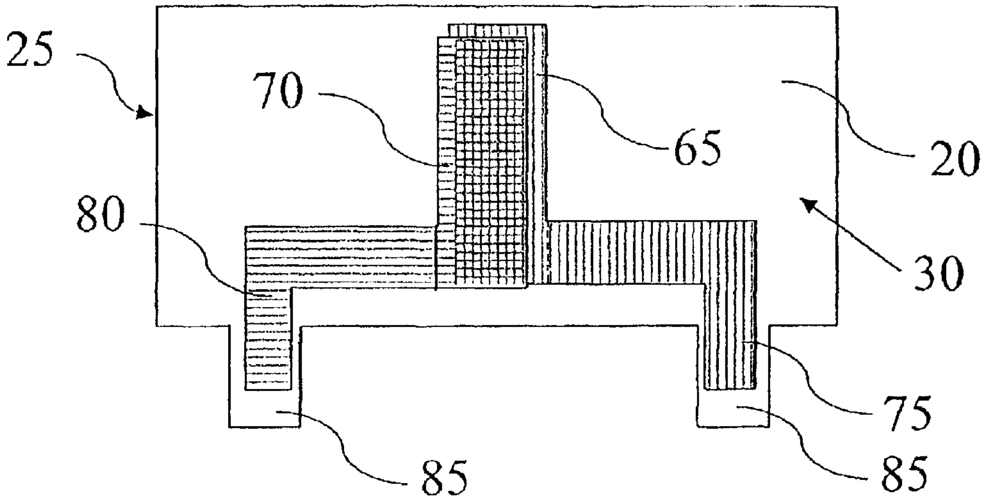
FIG. 5 is a schematic plan view of a piezoelectric film showing the form of electrode patterns applied to each surface for use in the receiver of FIG. 3.

Reference is now made to FIG. 5, which is a semi-transparent plan view of a piezoelectric film sheet forming cylindrical element 20 showing the form of electrode patterns applied to each surface for use in receiver 18 that is constructed and operable in accordance with a preferred embodiment of the invention. A first electrical connecting strip 75 is applied to inner surface 25 and first electrical connecting strip 75 is connected to first electrode 65. The application of first electrical connecting strip 75 is in a substantially non-opposing relationship with second electrode 70 to reduce problems associated with capacitance. A second electrical connecting strip 80 is applied to outer surface 30 and second electrical connecting strip 80 is connected to second electrode 70. The application of second electrical connecting strip 80 is in a substantially non-opposing relationship with first electrical connecting strip 75 to reduce problems associated with capacitance. It is also advantageous to apply first electrical connecting strip 75 in a substantially non-opposing relationship with second electrode 70 and second electrical connecting strip 80 in a substantially non-opposing relationship with first electrode 65 to avoid possible problems associated with capacitance. It should be noted that the terminology "substantially non-opposing" implies that it is preferable that a total non-opposing relationship exists so as to eliminate problems associated with capacitance. However, some opposition of electrical contact strips, although possibly increasing problems due to capacitance does not negate the essence of the invention, which is aimed at minimizing problems due to capacitance. First electrical connecting strip 75 and second electrical connecting strip 80 extend from first electrode 65 and second electrode 70 respectively to tabs 85 at lower edge 33 (FIG. 3) of cylindrical element 20.

Figure 6:
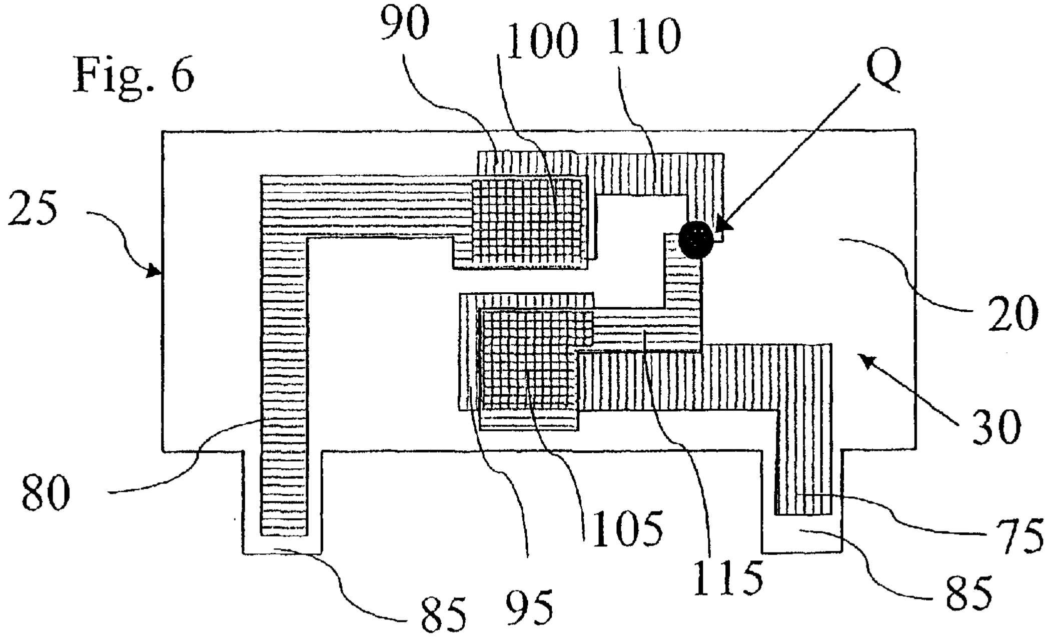
FIG. 6 is a schematic plan view of a piezoelectric film showing the form of multiple electrode patterns applied to each surface for use in the receiver of FIG. 3.

Reference is now made to FIG. 6, which is a semi-transparent plan view of the piezoelectric film sheet forming cylindrical element 20 showing the form of multiple electrode patterns applied to each surface for use in receiver 18 that is constructed and operable in accordance with a preferred embodiment of the invention. Increasing the cross-sectional area between the sensing and grounded electrode can increase the electrical current produced by an ultrasound transceiver. However, it is generally more advantageous to increase the electrical voltage produced by an ultrasound receiver. This can be achieved by having multiple electrode patterns set up in series. For receiver 18 this is achieved by applying a first electrode 90 and a second electrode 95 to inner surface 25 of cylindrical element 20. The application of first electrode 90 is in a pattern that is non-contiguous with second electrode 95. As discussed previously, in reference to the case of the single sensing electrode, first electrode 65 (FIG. 4), first and second electrodes 90, 95 are each formed as a strip. First and second electrodes 90, 95 extend in an extensional direction substantially parallel to central axis 40 along at least part of height h (FIG. 3). First electrode 90 and second electrode 95 in combination subtend an angle of not more than 90° at central axis 40. A third electrode 100 and a fourth electrode 105 are applied to outer surface 30 of cylindrical element 20, such that at least a part of third electrode 100 is in an opposing relationship with the majority of first electrode 90 and at least a part of fourth electrode 105 is in an opposing relationship with the majority of second electrode 95. The application of third electrode 100 is in a pattern that is non-contiguous with fourth electrode 105. Fourth electrode 105 is grounded. An electrical joining strip 110, 115 includes a first portion of electrical joining strip 110 on inner surface 25 and a second portion of electrical joining strip 115 on outer surface 30. First portion of electrical joining strip 110 extends from first electrode 90 to a hole Q in cylindrical element 20 and second portion of electrical joining strip 115 extends from hole Q to fourth electrode 105. First portion of electrical joining strip 110 and second portion of electrical joining strip 115 are joined at hole Q using conductive material. First electrical connecting strip 75 and second electrical connecting strip 80 discussed in reference to FIG. 5 can be used here for this embodiment of the invention. First electrical connecting strip 75 is applied to inner surface 25 and first electrical connecting strip 75 is connected to second electrode 95. Second electrical connecting strip 80 is applied to outer surface 30 and second electrical connecting strip 80 is connected to third electrode 100. The application of second electrical connecting strip 80 is also in a substantially non-opposing relationship with first electrical connecting strip 75, to reduce problems associated with capacitance across surfaces 25, 30 of cylindrical element 20. First electrical connecting strip 75 and second electrical connecting strip 80 extend from second electrode 95 and third electrode 100 respectively to tabs 85 at lower edge 33 (FIG. 3) of cylindrical element 20. It should be noted that first electrode 90 and second electrode 95 can be applied to outer surface 30 and third electrode 100 and fourth electrode 105 can be applied to inner surface 25 in an alternative embodiment of the invention. It should also be noted that more electrodes could be applied to cylindrical element 20 and connected in series to increase voltage output of receiver 18.

Figure 7:
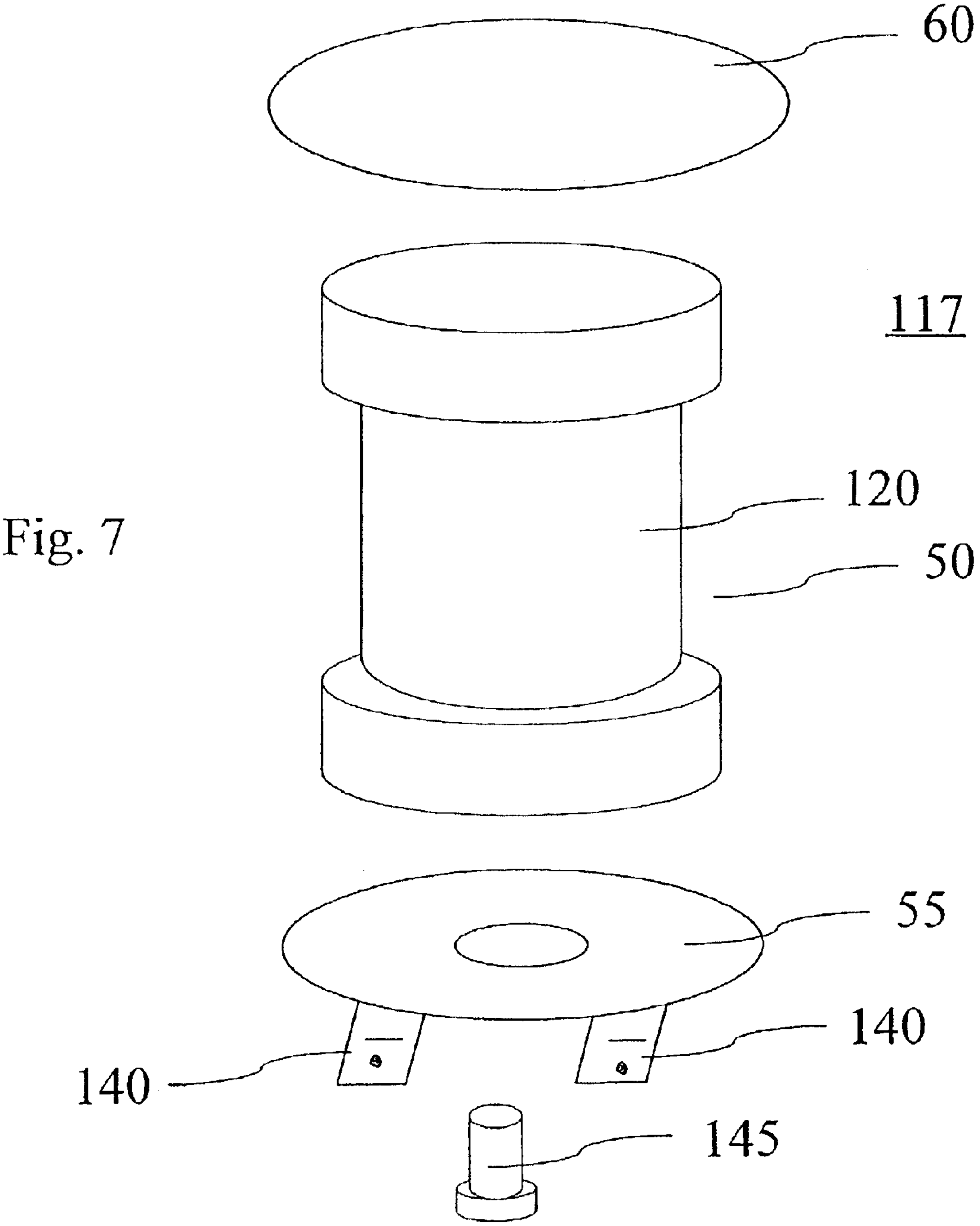
FIG. 7 is an exploded isometric view of a support structure for the receiver of FIG. 3.

Reference is now made to FIG. 7, which is an exploded isometric view of support structure 117 for receiver 18 that is constructed and operable in accordance with a preferred embodiment of the invention. As mentioned earlier, one major problem associated with implementation of a cylindrical ultrasound transducer using piezoelectric film is the tendency of the electrodes to function as an antenna for electromagnetic radiation. To minimize or eliminate this problem preferred implementations of the present invention include one or more features, which help to shield the sensing electrode from electromagnetic radiation. Firstly, second electrode 70, which is grounded, provides some shielding for first electrode 65. This, incidentally, is the reason it is preferred to position first electrode 65 on the inner surface of the film rather than externally thereto. A further or alternative contribution to electromagnetic shielding is preferably provided by employing an electrically grounded conductive core element 50 disposed within cylindrical element 20 in such a manner as to avoid electrical contact with first electrode 65. Core element 50 is typically, although not necessarily, part of support structure 117 for cylindrical element 20. One preferred implementation of core element 50 is a metal core element, which may be solid or hollow. In order to ensure that the film of cylindrical element 20 is free to vibrate, core element 50 is here formed with a reduced diameter portion 120 over a major part of its height. In certain cases, the non-contact regions defined by reduced diameter portion 120 may be sufficient to avoid electrical contact with first electrode 65. Alternatively, an additional insulating layer may be interposed between core element 50 and first electrode 65. An alternative implementation of core element 50 can be formed from a cylinder of conductive foam (not shown). In this case, contact between core element 50 and cylindrical element 20 typically does not significantly interfere with propagation of vibrations within cylindrical element 20. In this case, an additional insulating layer is generally required between core element 50 and first electrode 65. As mentioned above, cylindrical element 20 is supported from below by a base 55 and above by a cap 60. Base 55 includes electrical contact springs 140. Base 55 and cap 60 are secured to core element 50 by a bolt 145.

Figure 8:
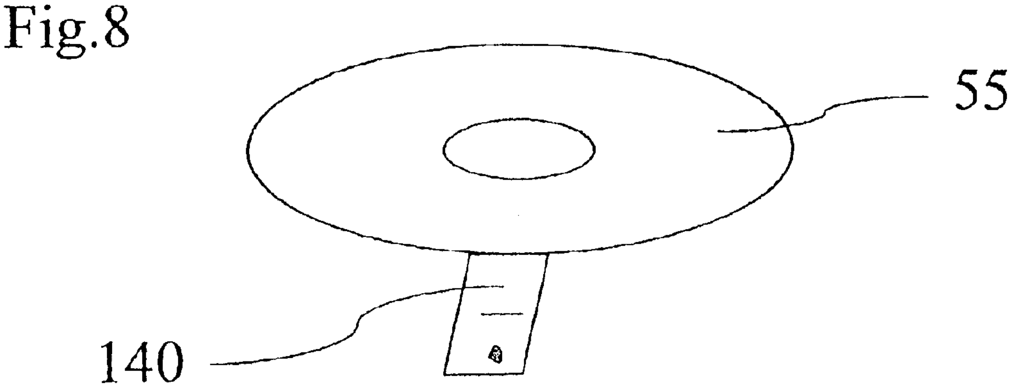
FIG. 8 is an isometric view showing a single electrical contact plate for use in the support structure of FIG. 7.

Reference is now made to FIG. 8, which is an isometric view showing a single electrical contact plate for use in support structure 117 that is constructed and operable in accordance with a preferred embodiment of the invention. Base 55 has one electrical contact spring 140. This can be used where electrical connecting strip 75, 80 are combined onto a single tab 85, or electrical connecting strips 75, 85 extend to different edges 32, 33 (FIG. 3) of cylindrical element 20.

Figure 9:
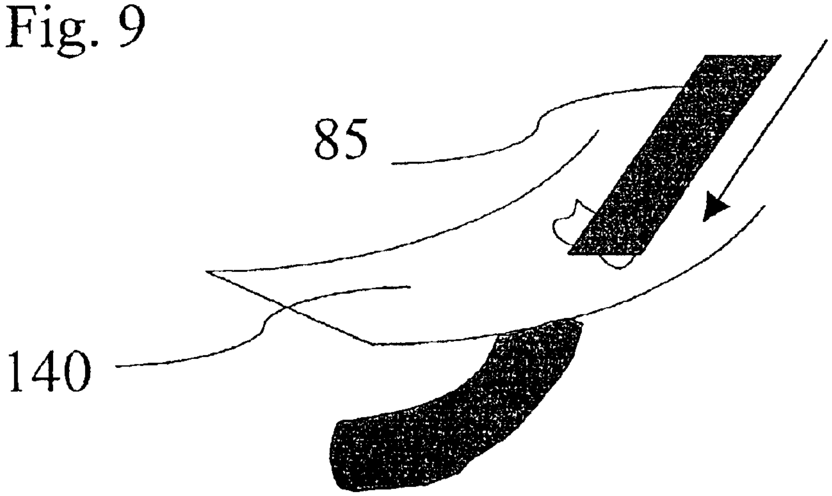
FIG. 9 is a schematic isometric view illustrating a technique for forming electrical contacts with the receiver of FIG. 3.

Reference is now made to FIG. 9, which is a schematic isometric view illustrating a technique for forming electrical contacts with receiver 18 that is constructed and operable in accordance with a preferred embodiment of the invention. A tab 85 containing an electrical connecting strip 75, 80 of receiver 18, is pushed into electrical contact spring 140. Tab 85 is held in place by the pressure of electrical contact spring 140.

Figure 10:
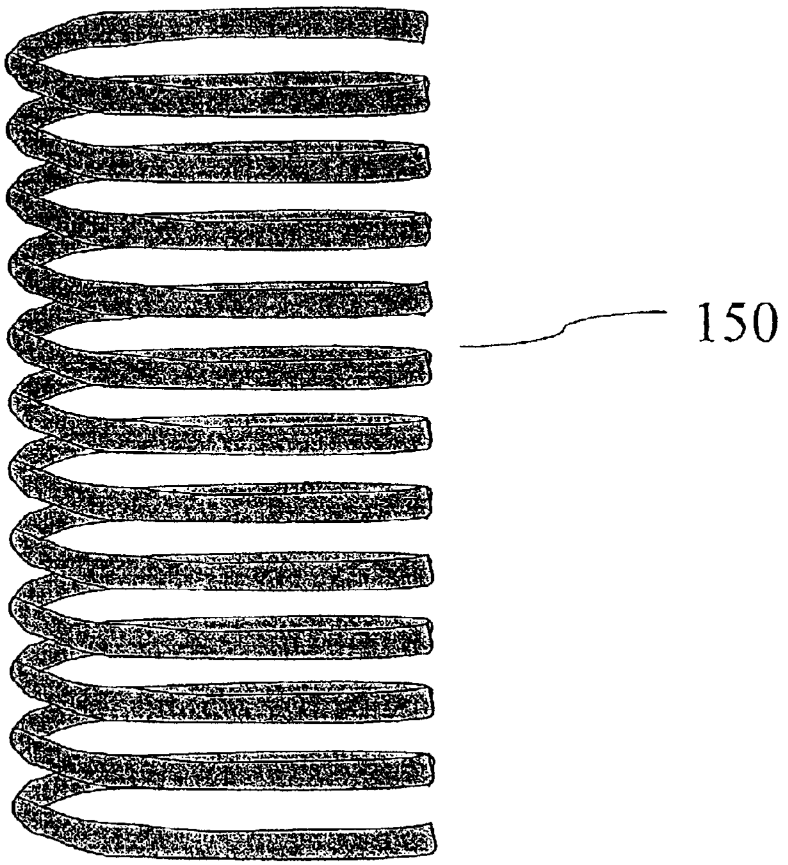
FIG. 10 is a schematic isometric view of a protective helical spring for use in the receiver of FIG. 3.

Reference is now made to FIG. 10, which is a schematic isometric view of a protective helical spring 150 for use in receiver 18, constructed and operational according to an embodiment of the present invention. Helical spring 150 is placed surrounding receiver 18. Helical spring 150 provides mechanical and electromagnetic shielding for receiver 18, while minimizing interference with the incident ultrasound waves, as will be explained below in reference to FIG. 11. Helical spring 150 is formed from a conductive material and is grounded to provide electromagnetic shielding.

Figure 11:
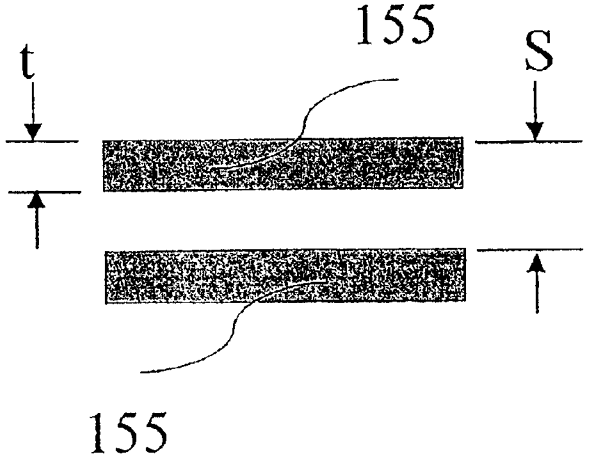
FIG. 11 is a side view of a section of the helical spring of FIG. 10.

Reference is now made to FIG. 11, which is a side view of a section of helical spring 150. Helical spring 150 has windings 155 of thickness t and a spatial period S. Mechanical protection must often be provided for transducers, particularly those using piezoelectric films that are easily damaged. Many existing transducer structures suffer from significant signal distortion alone or in combination with "blind spots" (i.e., directions in which transmitted intensity or sensitivity of reception are significantly impaired) due to the presence of various protective structures in front of the transducer. To minimize or eliminate such problems, the present invention uses helical spring 150 with windings 155 having a spatial period S of no more than $\lambda/2$, and preferably no more than $\lambda/4$, where $\lambda$ is the wavelength of the ultrasound working frequency in air. By using helical spring 150 with a spatial period S significantly smaller than existing systems, little or no directional disruption is caused to the ultrasound signals. By way of a practical example, for a working frequency of 90 kHz, corresponding to a wavelength in air of about 4 mm, a value for S of 1.9 mm has been found to offer minimal disruption to the transmission and reception of signals.

Figure 12:
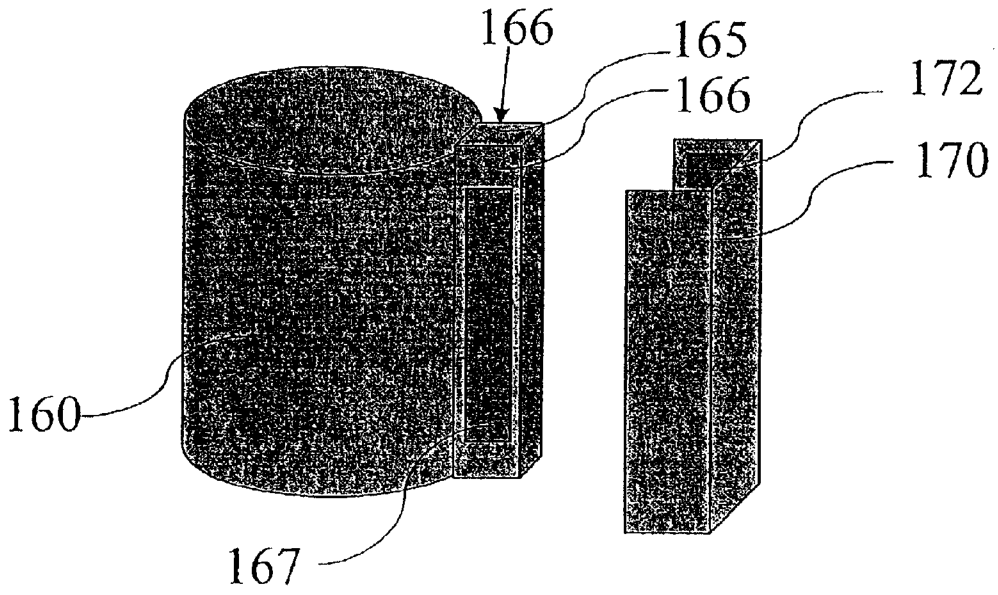
FIG. 12 is an exploded isometric view of a support structure for a cylindrical ultrasound transceiver that is constructed and operable in accordance with a most preferred embodiment of the invention.
Figure 13:
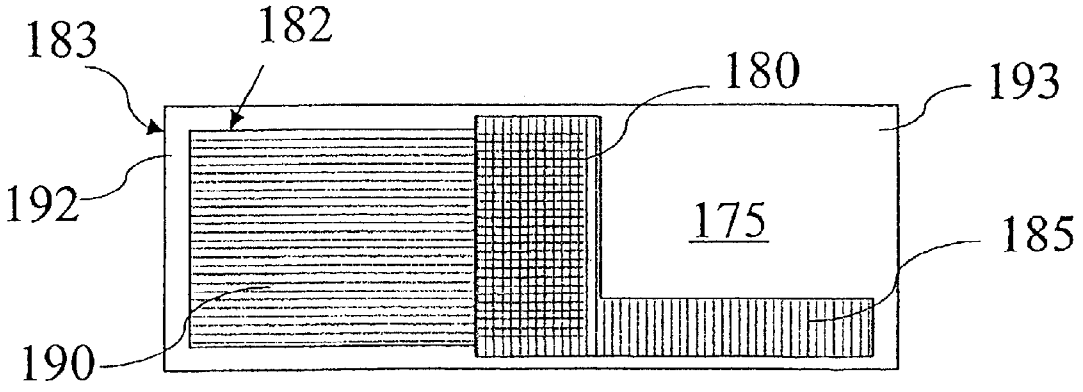
FIG. 13 is a schematic plan view of a piezoelectric film showing the form of electrode patterns applied to each surface for use in the transceiver of FIG. 12.

Reference is now made to FIGS. 12 and 13. FIG. 12 is an exploded isometric view of a support structure for receiver 18 that is constructed and operable in accordance with a most preferred embodiment of the invention. FIG. 13 is a semi-transparent plan view of a piezoelectric film 175 showing the form of electrode patterns applied to each surface for use in receiver 18 of FIG. 12. Welding piezoelectric film 175 to form cylindrical element 20 is an expensive process and welding can lead to damage to piezoelectric film 175. Piezoelectric film 175 used in cylindrical element 20 can be formed into cylindrical element 20 without welding piezoelectric film 175, while allowing propagation of vibration waves circumferentially around a major part of receiver 18. This is achieved by wrapping piezoelectric film 175 around a support structure 160, which is substantially cylindrical, with ends of film 192, 193 resting on a protrusion 165 on support structure 160. Protrusion 165 is typically an elongated projecting ridge that has its direction of elongation substantially parallel to the central axis of support structure 160. Protrusion 165 has substantially parallel clamping surfaces 166. A securing member, typically a clip 170 secures ends of film 192, 193 to protrusion 165 to form piezoelectric film 175 into a substantially cylindrical shape. Typically one securing member is used to secure ends of film 192, 193 to protrusion 165, however more than one securing member could be used to perform the same function. Clip 170 performs a clamping function that can be performed with other clip designs performing the same clamping function. Prior to wrapping piezoelectric film 175 on support structure 160, piezoelectric film is applied with the necessary electrodes and electrical contacts needed. A sensing electrode 180 is applied to a first side 182 of piezoelectric film 175 and a grounded electrode 190 is applied to a second side 183 of piezoelectric film 175. When piezoelectric film 175 is wrapped around support structure 160, first side 182 of piezoelectric film 175 will typically face towards support structure 160, thereby grounded electrode 190 is on the outside providing electromagnetic shielding for sensing electrode 180. Grounded electrode 190 substantially extends to one of ends 192 of piezoelectric film 175. Extended grounded electrode 190 provides additional electromagnetic shielding for sensing electrode 180 and also enables grounded electrode 190 to be connected directly to an electrical contact 172 on the inside of clip 170. An electrical connecting strip 185 is applied to first side 182 of piezoelectric film 175. Electrical connecting strip 185 extends from sensing electrode 180 to substantially the other one of ends 193 of piezoelectric film 175. This enables sensing electrode 190 to be connected directly to an electrical contact 167 on protrusion 165. It should be noted that many other electrode designs are possible such as adding an additional electrode to use piezoelectric film 175 in an ultrasound transceiver.

Figure 14:
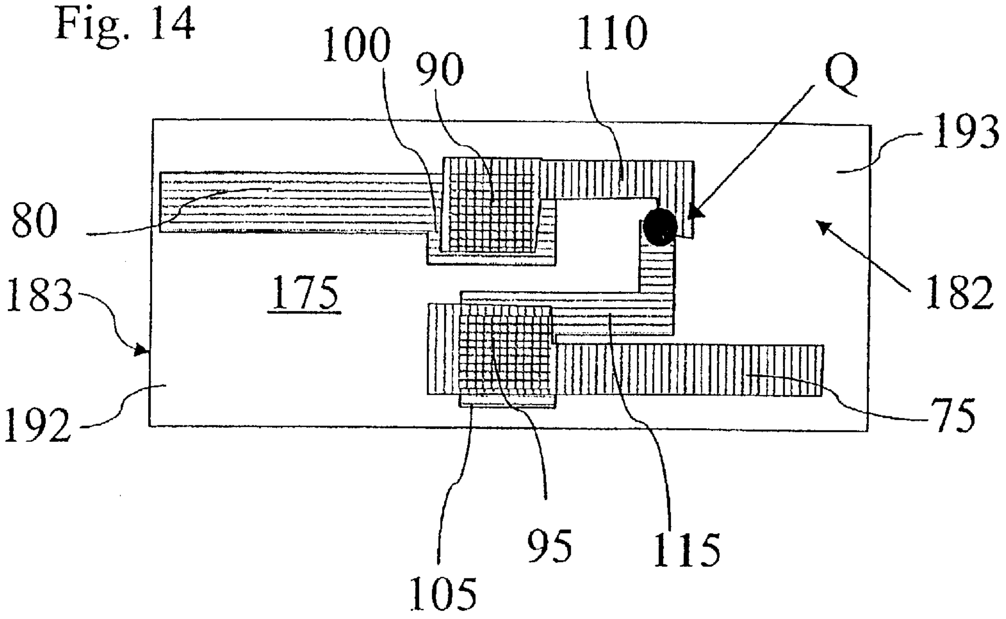
FIG. 14 is a schematic plan view of a piezoelectric film showing the form of multiple electrode patterns applied to each surface for use in the receiver of FIG. 12.

Reference is now made to FIG. 14, which is a schematic plan view of a piezoelectric film showing the form of multiple electrode patterns applied to each surface for use in the support structure of FIG. 12. In a most preferred embodiment of the invention, the multiple electrode patterns discussed in FIG. 6 can be adjusted for use with the support structure of FIG. 12. First electrode 90 and second electrode 95 are applied to first side 182 of piezoelectric film 175. Third electrode 100 and fourth electrode 105 are applied to second side 183 of piezoelectric film 175. Electrical joining strip 110, 115 extends from first electrode 90 via a hole Q in piezoelectric film 175 to fourth electrode 105. First electrical connecting strip 75 is connected to second electrode 95. Second electrical connecting strip 80 is connected to third electrode 100. First electrical connecting strip 75 and second electrical connecting strip 80 extend from second electrode 95 and third electrode 100 respectively to ends 192, 193 of piezoelectric film 175. The relative positions and non-overlapping of electrodes and electrical connecting strips has already been explained in reference to FIG. 6.

Reference is again made to FIG. 12. In a most preferred embodiment of the invention, mechanical protection and additional electromagnetic shielding can be provided for receiver 18 by placing helical spring 150 described in FIG. 10, 11 around receiver 18.

Figure 15:
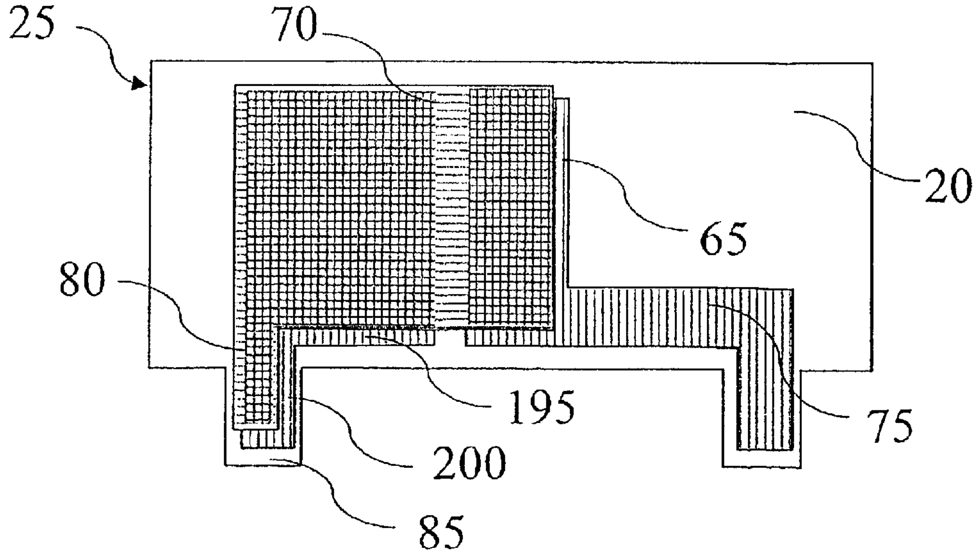
FIG. 15 is a schematic plan view of a piezoelectric film showing the form of electrode patterns applied to each surface for use as a transceiver in the receiver of FIG. 3.

Reference is now made to FIG. 15, which is a semi-transparent plan view of a piezoelectric film showing the form of electrode patterns applied to each surface for use as a transceiver that is constructed and operable in accordance with a preferred embodiment of the invention. Although device 18 has been described thus far as an ultrasound receiver, the same structure is highly suited for use in a transceiver system, i.e. for both receiving and transmitting signals, as will now be described. In addition to the application of first electrode 65, first electrical connecting strip 75, second electrode 70 and second electrical connecting strip 80 (all described in reference to FIG. 5 above), an additional electrode 195 is applied to inner surface 25 of cylindrical element 20. Additional electrode 195 is connected to an electrical connecting strip 200 that extends to tab 85. Second electrode 70 is enlarged to cover a larger area of cylindrical element 20. The application of additional electrode 195 is in a pattern that is non-contiguous with first electrode 65 and in a substantially opposing relationship with second electrode 70. When not in use as a transmitter additional electrode 195 can be grounded to provide additional electromagnetic shielding. When in use as a transmitter, a driving potential can be applied between additional electrode 195, together with first electrode 65, if required and second electrode 70 to generate an ultrasound signal, similar to the operation of a conventional cylindrical ultrasound transmitter.

Figure 16:
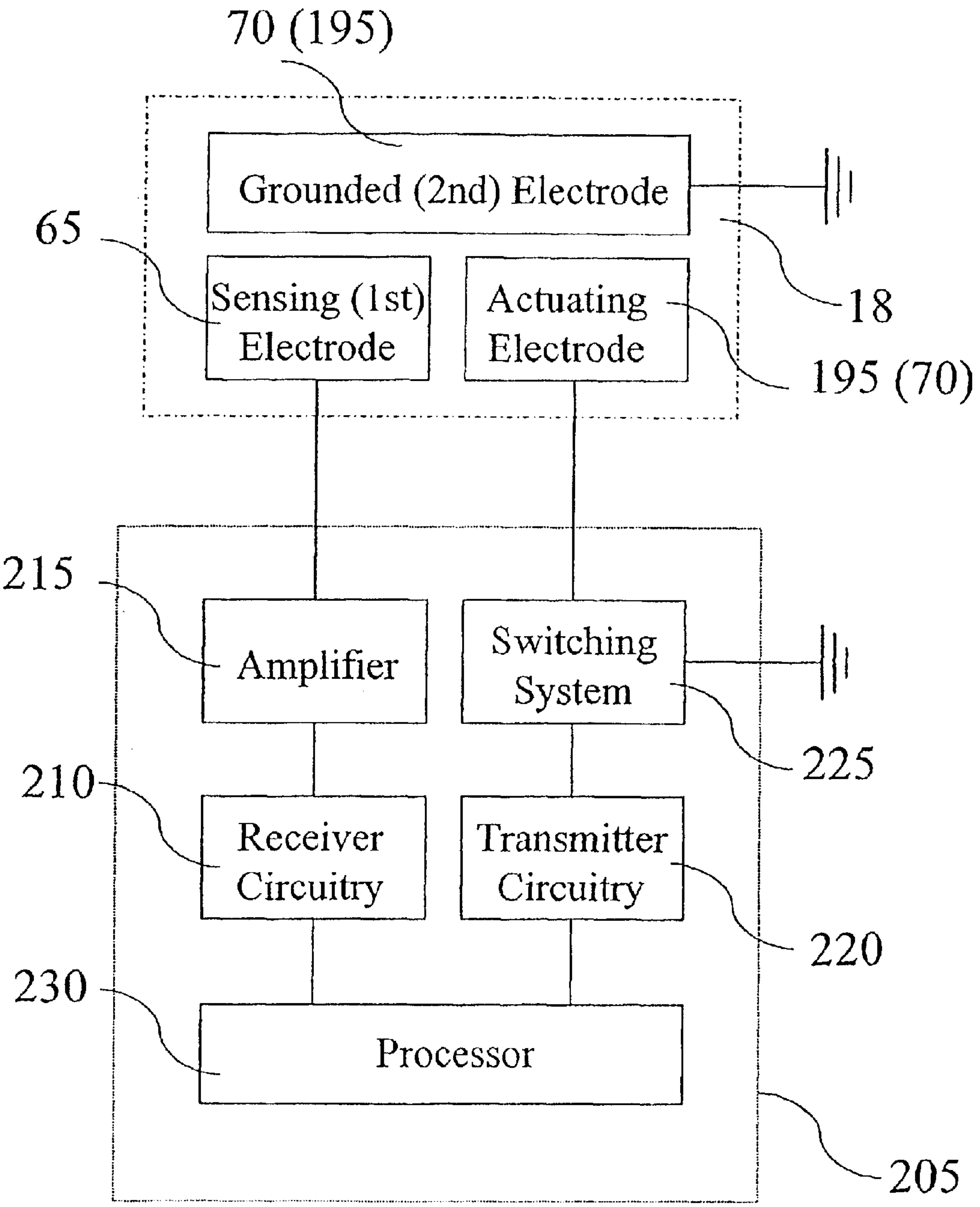
FIG. 16 is a block diagram illustrating the main components of a transceiver assembly including the transceiver of FIG. 15.

Reference is now made to FIG. 16, which is a block diagram illustrating the main components of a transceiver assembly employing device 18. As mentioned earlier, it is advantageous that both second electrode 70 and additional electrode(s) 195 are grounded for shielding purposes during reception of ultrasound signals. In order to maintain this advantage, a switching system 225 may be used to selectively switch connection of second electrode 70 or additional electrode 195 to transmitter circuitry when transmission is required. Thus, there is shown a representation of a transceiver assembly, employing device 18. The transceiver assembly further includes a control module 205 having receiver circuitry 210 electrically connected to first electrode 65, typically via an amplifier 215. Control module 205 also includes transmitter circuitry 220, and switching system 225. Switching system 225 is associated with either second electrode 70 or additional electrode 195 which serves as an actuating electrode, alternately connecting it to the transmitter circuitry for transmission and to ground during reception. The entire assembly is typically operated under control of a processor 230, details of which are not essential to the present invention.

In operation, when the assembly is being used for reception, both additional electrode 195 and second electrode 70 are connected to ground, thereby offering the maximum available electromagnetic shielding. When transmission is required, a driving voltage is applied to either second electrode 70 or additional electrode 195 to generate the desired signal.

It should be noted at this point that many variations and refinements might be made within the scope of the principles of the present invention. By way of example, it should be noted that receiver 18 may employ more than one sensing electrode spaced around cylindrical element 20. This may be useful for a number of reasons. Firstly, by analyzing the detected signals separately and identifying phase differences between the signals, it is possible to derive approximate direction information from measurements at a single receiver. Alternatively, in an example in which the wavelength is short compared to the size of cylindrical element 20, it may be possible to choose the spacing of a number of commonly connected sensing electrodes to achieve inherent tuning of the receiver to frequencies of interest. In other words, if the spacing corresponds to in-phase spacing around cylindrical element 20 for a given frequency, the signals from each sensing electrode will have the same sign and will add up to an increased amplitude. At many other frequencies, some degree of cancellation will occur as was described in the context of FIG. 2 above.

As mentioned earlier, cylindrical element 20 is preferably configured so that is supports only about a single wavelength of the vibration waves within the piezoelectric film induced by ultrasound signals at the working frequency. More specifically, half of the circumference ($\pi D/2$, D being the diameter of the cylindrical element) is preferably equal to the wavelength of the vibration waves within the film. For this reason, the diameter of cylindrical element 20 is generally chosen to be inversely proportional to the intended working frequency. By way of example, for a working frequency of 90 kHz, a cylindrical element of diameter about 5 mm is generally preferred.

Reference is now made to FIG. 17, which is a schematic representation of the operation of a system for determining the position of a moveable element 240, constructed and operable in accordance with a preferred embodiment of the invention, operating in a primary mode of operation. It should be noted that the transceiver functionality of transducers 18 of the present invention are particularly useful for implementing a self-calibration mode according to another aspect of the present invention which offers increased precision and reliability in a system for determining the position of moveable element 240. The system includes a moveable ultrasound transducer 235 associated with moveable element 240 and at least two ultrasound transducers 245, 250 maintained in fixed geometrical relation by attachment to a base unit 255. In the case illustrated here, the normal measurement mode of the system includes transmitting at least one measurement signal from moveable ultrasound transducer 235 which is received by fixed ultrasound transducers 245, 250. A position of moveable element 240 is then derived using time-of-flight measurements for the ultrasound measurement signal.

Reference is now made to FIG. 18, which is a schematic representation of the operation of the above system while performing a self-calibration operation. By way of introduction, it should be noted that ultrasound time-of-flight based digitizer systems suffer from problems of accuracy due to significant variations in the speed of sound through air which result from changes in temperature, pressure or humidity. In order to compensate for such variations, the present aspect of the present invention provides a self-calibration facility whereby, the system is also intermittently operated in a calibration mode. In this mode transducer 245 switches from its normal receiving function to transmitting, sending out a calibration signal which is received by transducer 250. Since the distance between transducers 245, 250 is a fixed value defined by the structure of base unit 255, time-of-flight measurements for the calibration signal can be used to derive calibration information indicative of variations in the speed of sound in the environment within which the system is currently operating. This calibration information is then used to correct the derivation of the position of moveable element 240.

Reference is now briefly made to FIGS. 19 and 20. These illustrate an implementation of this aspect of the present invention for a system where the moveable transducer 235 functions as a receiver for receiving signals transmitted by fixed transducers 245 and 250. In this case, the calibration mode is implemented by momentarily employing transducer 250 as a receiver to receive a calibration signal transmitted by transducer 245. In all other respects, the principles of the invention remain as before.

Figure 21:
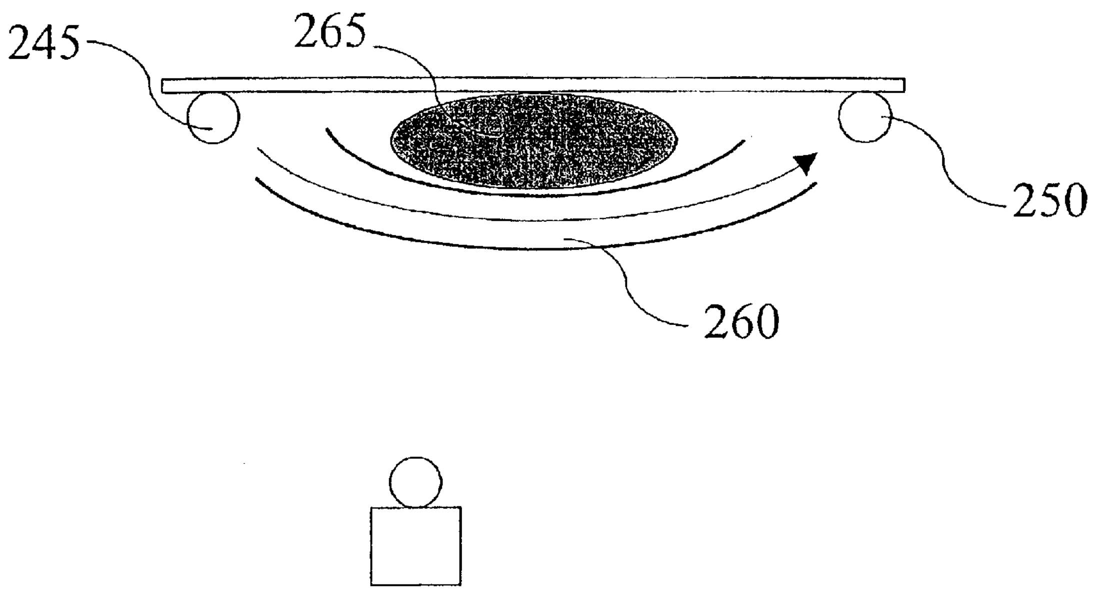
FIG. 21 is a schematic representation of the system of FIG. 17 while performing a self-calibration mode using an acoustic wave-guide.

Reference is now made to FIG. 21, which is a schematic representation of the system while performing a self-calibration mode using an acoustic wave-guide 260. By way of introduction, it should be noted that a physical obstruction 265 could block the path of the calibration signal. Physical obstruction 265 may be due to the inherent design of the system or an external obstruction. Acoustic wave-guide 260 is placed between fixed transducers 245, 250. Acoustic wave-guide 260 ensures that the calibration signal transmitted by one fixed transducer 245 is received by the other fixed transducer 250. Acoustic wave-guide 260 is an elongated tube which can either be straight or curved depending on physical obstruction 265.

Figure 22:
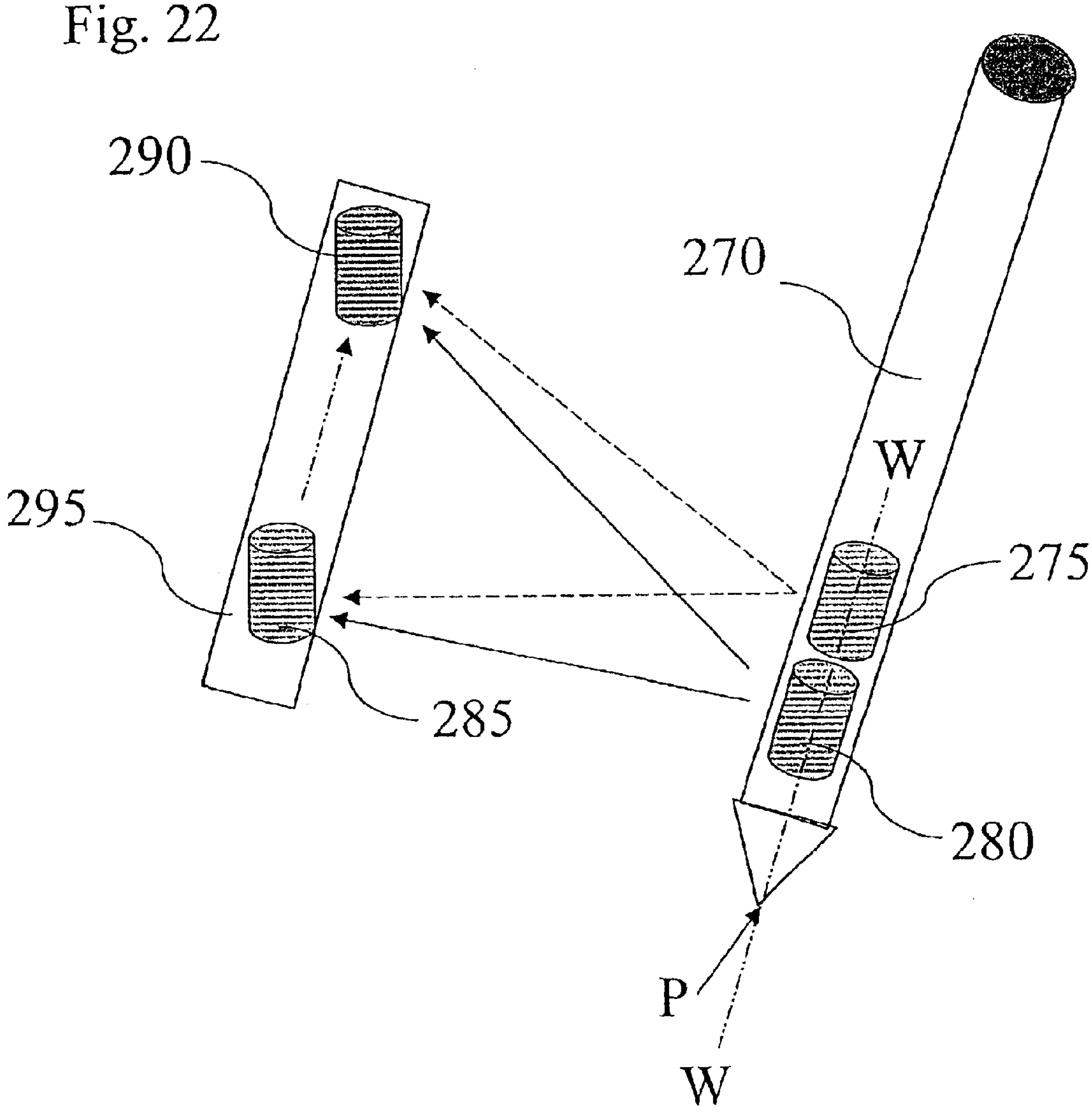
FIG. 22 is a schematic representation of the operation of a system for determining the position of a point on a moveable element, constructed and operable in accordance with an alternate embodiment of the invention.

Reference is now made to FIG. 22, which is a schematic representation of the operation of a system for determining the position of a point P on a moveable element 270, constructed and operable in accordance with a preferred embodiment of the invention. By way of introduction, ultrasound time-of-flight based digitizer systems suffer from problems of accuracy due to the fact that the transducers cannot normally be placed exactly at the position to be determined. For example, in the case of ultrasound time-of-flight based digitizer systems involving electronic pens, the transducer will be above the nib of the pen. If the pen is tilted, as is commonly the case, the nib and the ultrasound transducer will be at different horizontal positions in the plane of measurement. In order to compensate for such variations, the present aspect of the present invention provides a system to correct for the tilt error. The system includes maintaining two ultrasound transducers 275, 280 and point P in fixed geometric relation along a common axis W, by attaching two ultrasound transducers 275, 280 to moveable element 270. The cylindrical form of the ultrasound transducers provides all-around signal transmission and simplifies the geometry of time-of-flight calculations by providing an effect similar to a point (or more accurately, line) source. Therefore, ultrasound transducers 275, 280 are centered on common axis W. It should be noted that ultrasound transducer 280 is typically positioned as close to point P as possible and ultrasound transducer 275 is typically positioned as distant from ultrasound transducer 280 as possible to give better correction for the tilt error. It is also possible to use more than two transducers in the moveable element to allow for problems resulting from temporary blocking of ultrasound signals to one of the transducers. The system also includes another two ultrasound transducers 285, 290 maintained in fixed geometrical relation by attachment to a base unit 295. In the case illustrated here, the normal measurement mode of the system includes transmitting a first measurement signal from ultrasound transducer 275 to be received by ultrasound transducers 285, 290. A second measurement signal is transmitted from ultrasound transducer 280 to be received by ultrasound transducers 285, 290. The first and second measurement signals are sequential. Distances between ultrasound transducer 275 and each of ultrasound transducers 285, 290 are derived from time-of-flight measurements for the first measurement signal. Distances between ultrasound transducer 280 and each of ultrasound transducers 285, 290 are derived from time-of-flight measurements for the second measurement signal. A position of point P is derived from geometrical calculations for the above-calculated distances.

The system also intermittently operates in a calibration mode by sending a calibration signal between fixed ultrasound transducers 285, 290. This calibration information is then used to correct the derivation of the position of point P.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art which would occur to persons skilled in the art upon reading the foregoing description.

What is claimed is:

1. An ultrasound transducer comprising:

(a) a piezoelectric film having a first end and a second end;

(b) a plurality of electrodes disposed on said piezoelectric film;

(c) at least one securing member; and (d) a support structure, which is substantially cylindrical, said support structure including a protrusion formed as an elongated projecting ridge having a direction of elongation, said support structure having a central axis, said direction of elongation being substantially parallel to said central axis, said first end and said second end being secured to said protrusion of said support structure by said at least one securing member.

2. The ultrasound transducer of claim 1 further comprising an electrical contact disposed on said support structure.

3. The ultrasound transducer of claim 1 further comprising an electrical contact disposed on said protrusion.

4. The ultrasound transducer of claim 1 wherein said at least one securing member is a clip.

5. The ultrasound transducer of claim 1 further comprising an electrical contact wherein said electrical contact is disposed on said at least one securing member.

6. The ultrasound transducer of claim 1 wherein said piezoelectric film has a first surface and a second surface and wherein said electrodes include:

(a) a first electrode disposed on said first surface;

(b) a second electrode disposed on said second surface wherein at least a part of said second electrode is in an opposing relationship with at least a part of said first electrode;

(c) a first electrical connecting strip disposed on said first surface wherein said first electrical connecting strip is connected to said first electrode; and (d) a second electrical connecting strip disposed on said second surface in a substantially non-opposing relationship with said first electrical connecting strip wherein said second electrical connecting strip is connected to said second electrode.

7. The ultrasound transducer of claim 1 wherein said piezoelectric film has a first surface and a second surface and wherein said electrodes include:

(a) a first electrode and a second electrode disposed on said first surface, wherein said first electrode is disposed in a pattern that is non-contiguous with said second electrode;

(b) a third electrode and a fourth electrode disposed on said second surface, wherein:

(i) at least a part of said third electrode is in an opposing relationship with at least a part of said first electrode;

(ii) at least a part of said fourth electrode is in an opposing relationship with at least a part of said second electrode; and (iii) said third electrode is disposed in a pattern that is non-contiguous with said fourth electrode; and (c) an electrical joining strip extending from said first electrode to said fourth electrode, wherein said electrical joining strip includes a first portion of said electrical joining strip on said first surface and a second portion of said electrical joining strip on said second surface, and wherein said first portion and said second portion are electrically connected.

8. The ultrasound transducer of claim 7 wherein said first portion and said second portion are electrically connected via a hole in said piezoelectric film.

9. The ultrasound transducer of claim 1 further comprising a helical metal spring, wherein said helical metal spring is disposed around said piezoelectric film.

10. An ultrasound receiver comprising:

(a) a piezoelectric film having a first surface and a second surface;

(b) a first electrode disposed on said first surface;

(c) a second electrode disposed on said second surface wherein at least a part of said second electrode is in an opposing relationship with at least a part of said first electrode;

(d) a first electrical connecting strip disposed on said first surface wherein said first electrical connecting strip is connected to said first electrode;

(e) a second electrical connecting strip disposed on said second surface in a substantially non-opposing relationship with said first electrical connecting strip wherein said second electrical connecting strip is connected to said second electrode;

(f) a substantially cylindrical element, which is hollow, formed primarily from said piezoelectric film, said substantially cylindrical element having a central axis and a height measured parallel to said central axis; and (g) a support structure for supporting said substantially cylindrical element, said support structure being configured to support said substantially cylindrical element in such a manner as to allow propagation of vibration waves circumferentially around a major part of said substantially cylindrical element; wherein said first electrode is formed as a strip extending in an extensional direction substantially parallel to said central axis along at least a part of said height, said strip subtending at said central axis an angle of not more than 90°.

11. The ultrasound receiver according to claim 10 wherein:

(a) said first electrical connecting strip is in a substantially non-opposing relationship with said second electrode; and (b) said second electrical connecting strip is in a substantially non-opposing relationship with said first electrode.

12. The ultrasound receiver according to claim 10 wherein:

(a) said substantially cylindrical element has an inner surface wherein said first surface forms said inner surface; and (b) said second electrode is grounded.

13. A multi-electrode ultrasound receiver comprising:

(a) a piezoelectric film having a first surface and a second surface;

(b) a first electrode and a second electrode disposed on said first surface, wherein said first electrode is disposed in a pattern that is non-contiguous with said second electrode;

(c) a third electrode and a fourth electrode disposed on said second surface, wherein:

(i) at leapt a part of said third electrode is in an opposing relationship with at least a part of said first electrode;

(ii) at least a part of said fourth electrode is in an opposing relationship with at least a part of said second electrode; and (iii) said third electrode is disposed in a pattern that is non-contiguous with said fourth electrode;

(d) an electrical joining strip extending from said first electrode to said fourth electrode wherein said electrical joining strip includes a first portion of said electrical joining strip on said first surface and a second portion of said electrical joining strip on said second surface and said first portion and said second portion being electrically connected;

(e) a substantially cylindrical element, which is hollow, formed primarily from said piezoelectric film, said substantially cylindrical element having a central axis and a height measured parallel to said central axis, said first electrode and said second electrode in combination subtending at said central axis an angle of not more than 90°; and (f) a support structure for supporting said substantially cylindrical element, said support structure being configured to support said substantially cylindrical element in such a manner as to allow propagation of vibration waves circumferentially around a major part of said substantially cylindrical element.

14. The multi-electrode ultrasound receiver according to claim 13 wherein:

(a) said substantially cylindrical element has an inner surface wherein said first surface forms said inner surface; and (b) said third electrode is grounded.

15. The multi-electrode ultrasound receiver according to claim 13 wherein said first portion and said second portion are electrically connected via a hole in said piezoelectric film.

16. The multi-electrode ultrasound receiver according to claim 13 further comprising:

(a) a first electrical connecting strip disposed on said first surface, wherein said first electrical connecting strip is connected to said second electrode; and (b) a second electrical connecting strip disposed on said second surface, wherein said second electrical connecting strip is connected to said third electrode and said second electrical connecting strip is in a substantially non-opposing relationship with said first electrical connecting strip.

* * * * *